(12) United States Patent
Gillotti

(10) Patent No.: US 12,255,109 B2
(45) Date of Patent: *Mar. 18, 2025

(54) METHODS OF DETECTING BONDING BETWEEN A BONDING WIRE AND A BONDING LOCATION ON A WIRE BONDING MACHINE

(71) Applicant: Kulicke and Soffa Industries, Inc., Fort Washington, PA (US)

(72) Inventor: Gary S. Gillotti, North Wales, PA (US)

(73) Assignee: Kulicke and Soffa Industries, inc., Fort Washington, PA (US)

( * ) Notice: Subject to any disclaimer, the term of this patent is extended or adjusted under 35 U.S.C. 154(b) by 213 days.

This patent is subject to a terminal disclaimer.

(21) Appl. No.: 17/852,561

(22) Filed: Jun. 29, 2022

(65) Prior Publication Data
US 2022/0328367 A1   Oct. 13, 2022

Related U.S. Application Data

(63) Continuation of application No. 16/930,494, filed on Jul. 16, 2020, now Pat. No. 11,404,330, which is a
(Continued)

(51) Int. Cl.
*H01L 21/66* (2006.01)
*H01L 23/00* (2006.01)

(52) U.S. Cl.
CPC ............ *H01L 22/12* (2013.01); *H01L 22/14* (2013.01); *H01L 24/78* (2013.01); *H01L 24/85* (2013.01);
(Continued)

(58) Field of Classification Search
CPC .................................... H01L 2224/859
See application file for complete search history.

(56) References Cited

U.S. PATENT DOCUMENTS 6,189,765 B1 * 2/2001 Moon ............... B23K 20/007
228/103
7,699,209 B2   4/2010 Tei
(Continued)

FOREIGN PATENT DOCUMENTS

JP   2011-199203 A   10/2011
KR   10-2006-0043245 A   5/2006
(Continued)

OTHER PUBLICATIONS

International Search Report Dated Oct. 18, 2019 for International Patent Application No. PCT/US2019/039248.

*Primary Examiner* — Yu-Hsi D Sun
(74) *Attorney, Agent, or Firm* — Christopher M. Spletzer, Sr.

(57) ABSTRACT

A method of determining a bonding status between wire and at least one bonding location of a semiconductor device is provided. The method includes the steps of: (a) bonding a portion of wire to at least one bonding location of a semiconductor device using a bonding tool of a wire bonding machine; and (b) detecting whether another portion of wire engaged with the bonding tool, and separate from the portion of wire, contacts the portion of wire in a predetermined height range, thereby determining if the portion of wire is bonded to the at least one bonding location.

18 Claims, 29 Drawing Sheets

Related U.S. Application Data continuation of application No. 16/453,312, filed on Jun. 26, 2019, now Pat. No. 10,755,988.

(60) Provisional application No. 62/692,608, filed on Jun. 29, 2018.

(52) U.S. Cl.
CPC .. *H01L 2224/789* (2013.01); *H01L 2224/859* (2013.01)

(56) References Cited

U.S. PATENT DOCUMENTS

| | | |
|---|---|---|
| 8,245,902 B2 | 8/2012 | Lee et al. |
| 9,704,797 B2 * | 7/2017 | Lu .......................... H01L 24/49 |
| 2005/0194422 A1 | 9/2005 | Takahashi et al. |
| 2010/0155455 A1 | 6/2010 | Mii et al. |
| 2013/0180957 A1 | 7/2013 | Lee et al. |
| 2013/0200530 A1 | 8/2013 | Song et al. |

FOREIGN PATENT DOCUMENTS

| | | |
|---|---|---|
| KR | 10-2009-0100125 A | 9/2009 |
| KR | 10-2012-0048254 A | 5/2012 |
| WO | 2009-002345 | 12/2008 |

* cited by examiner

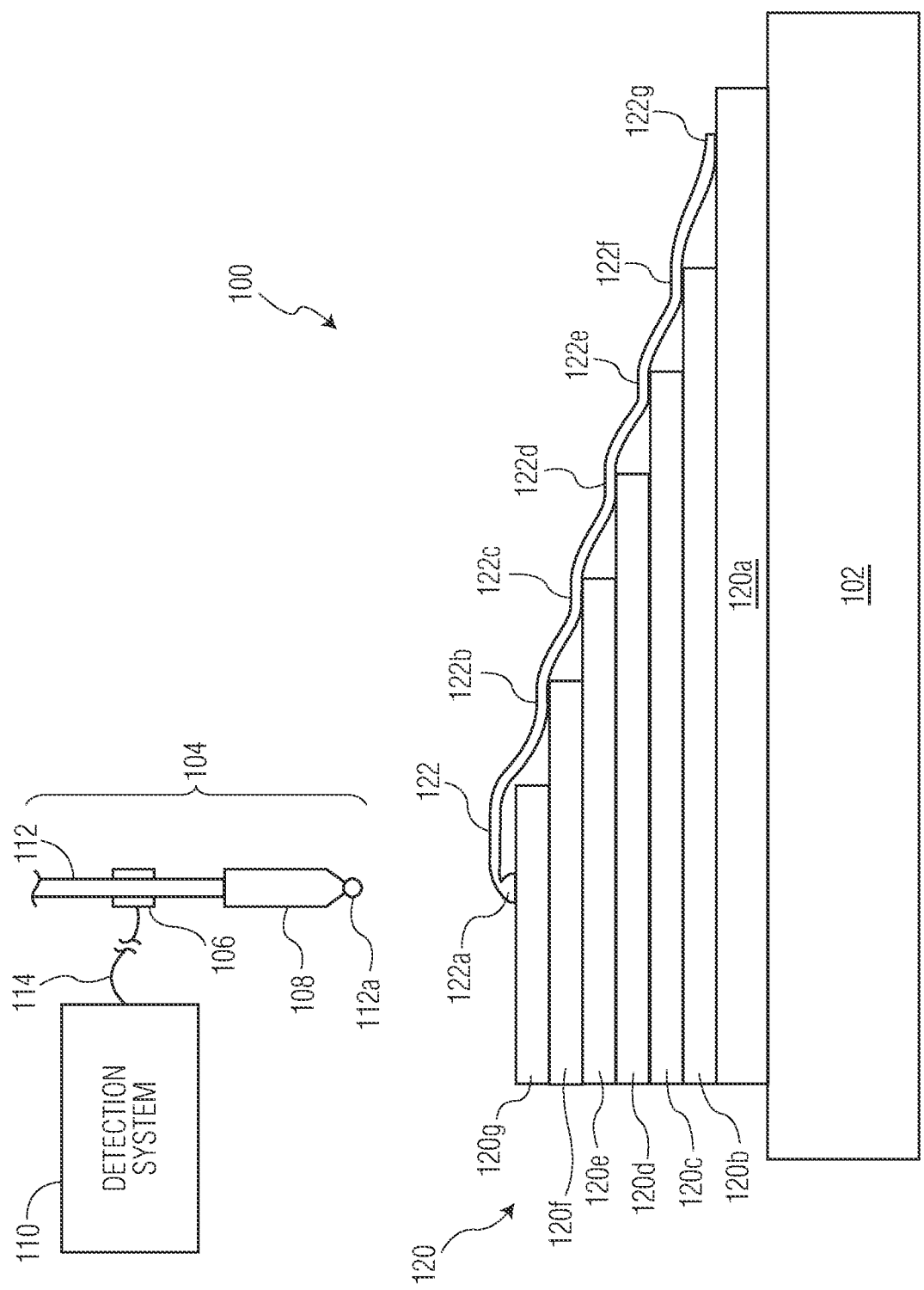

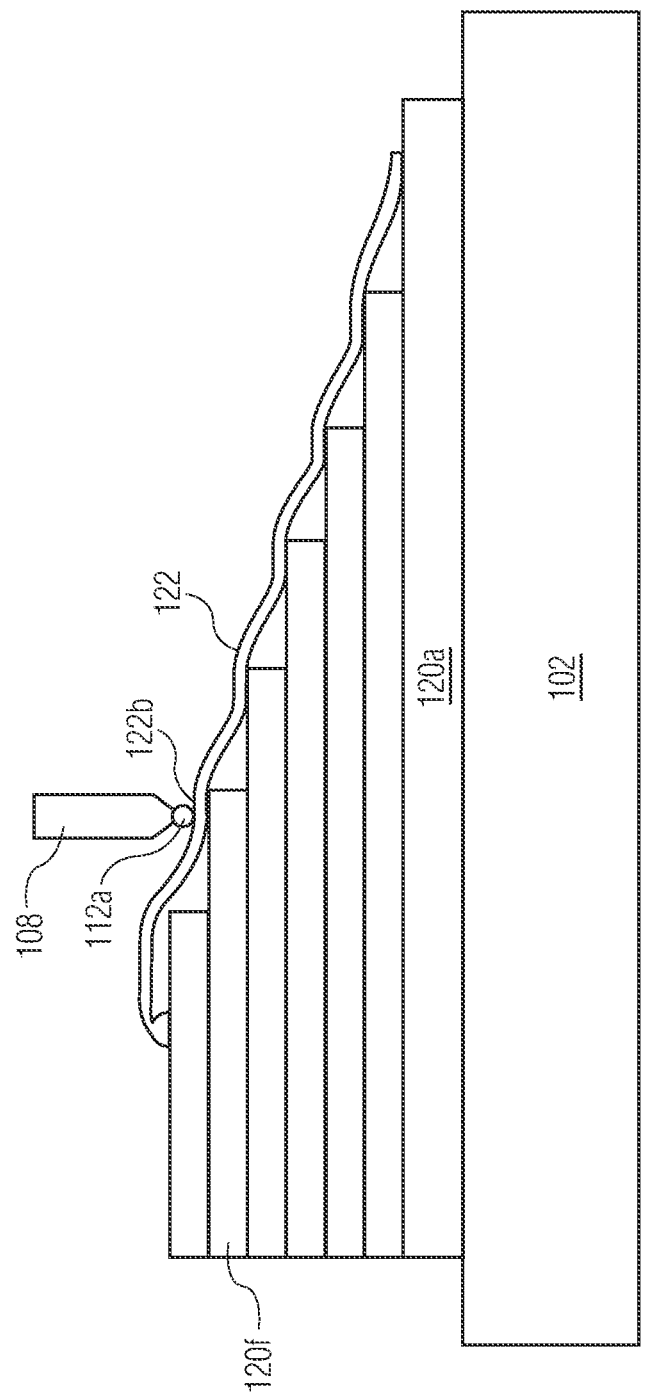

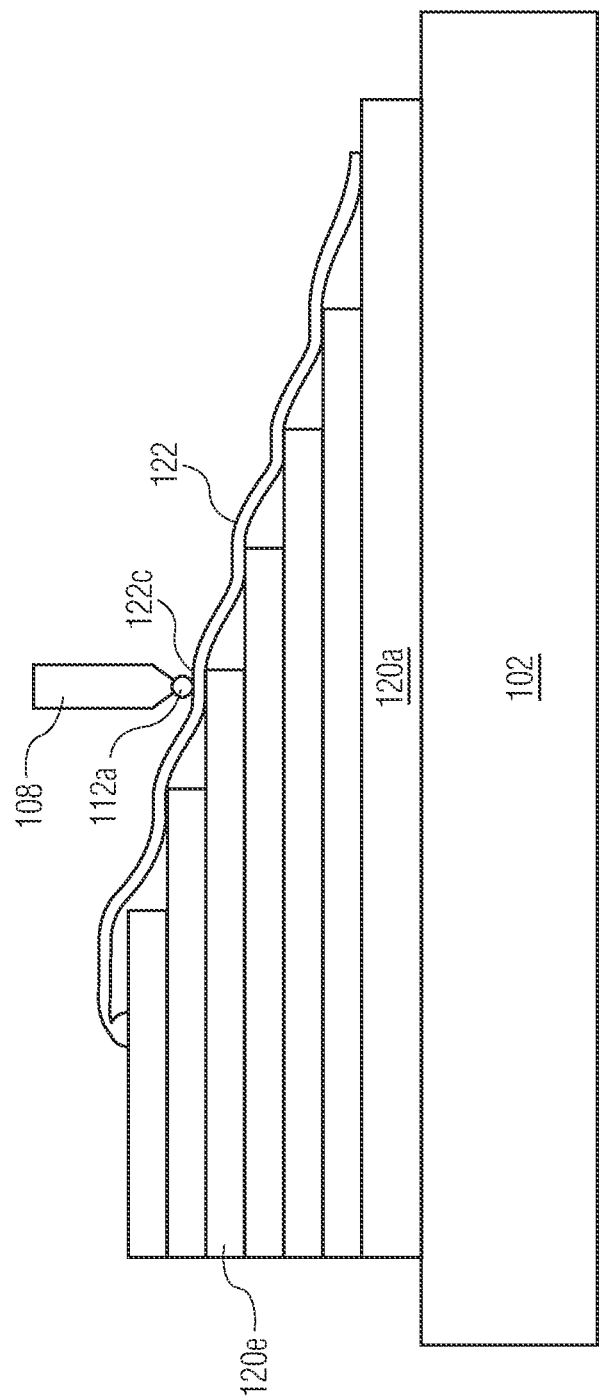

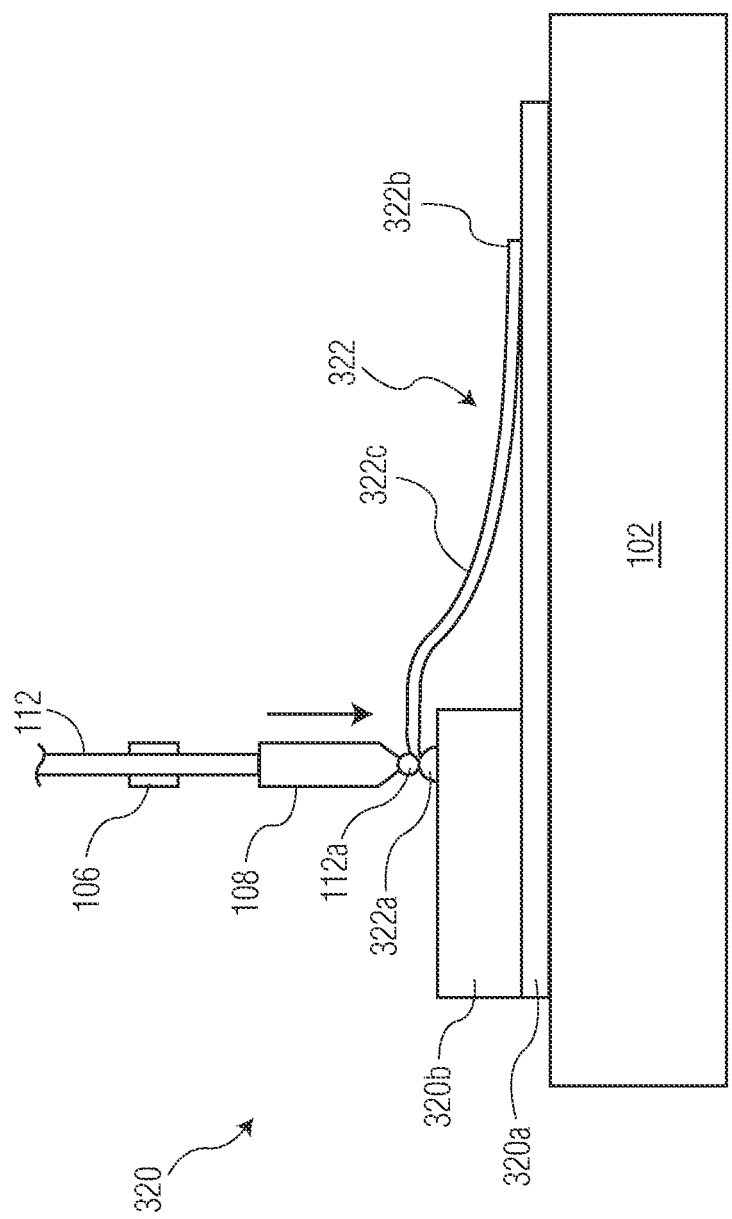

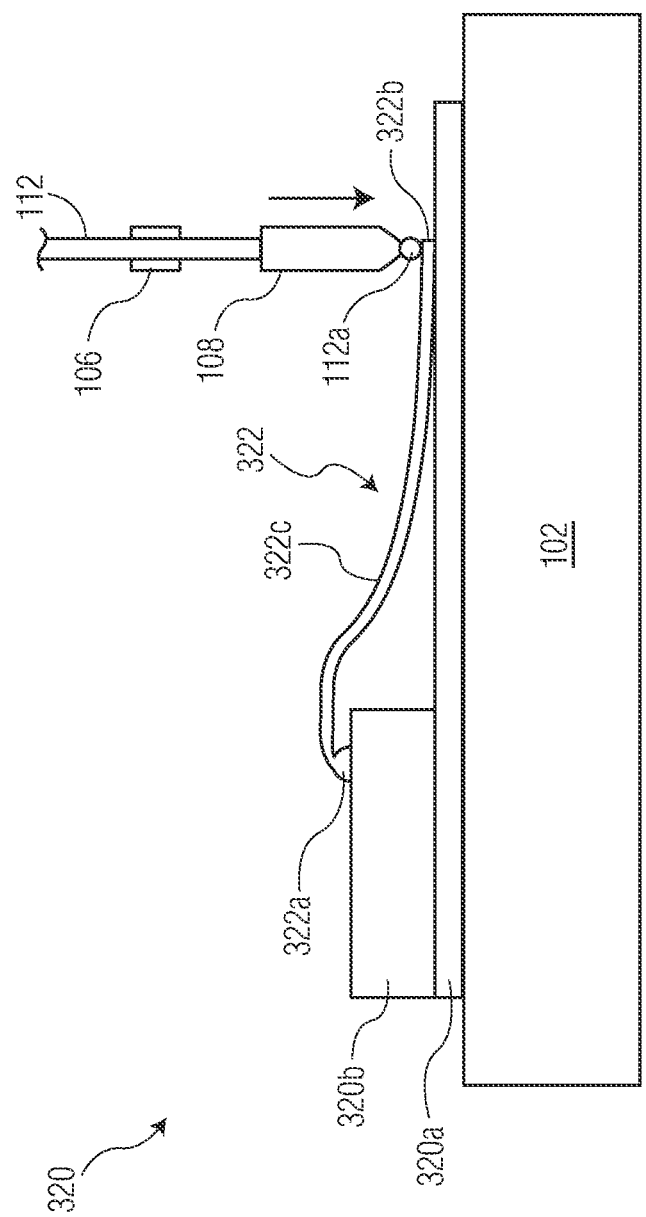

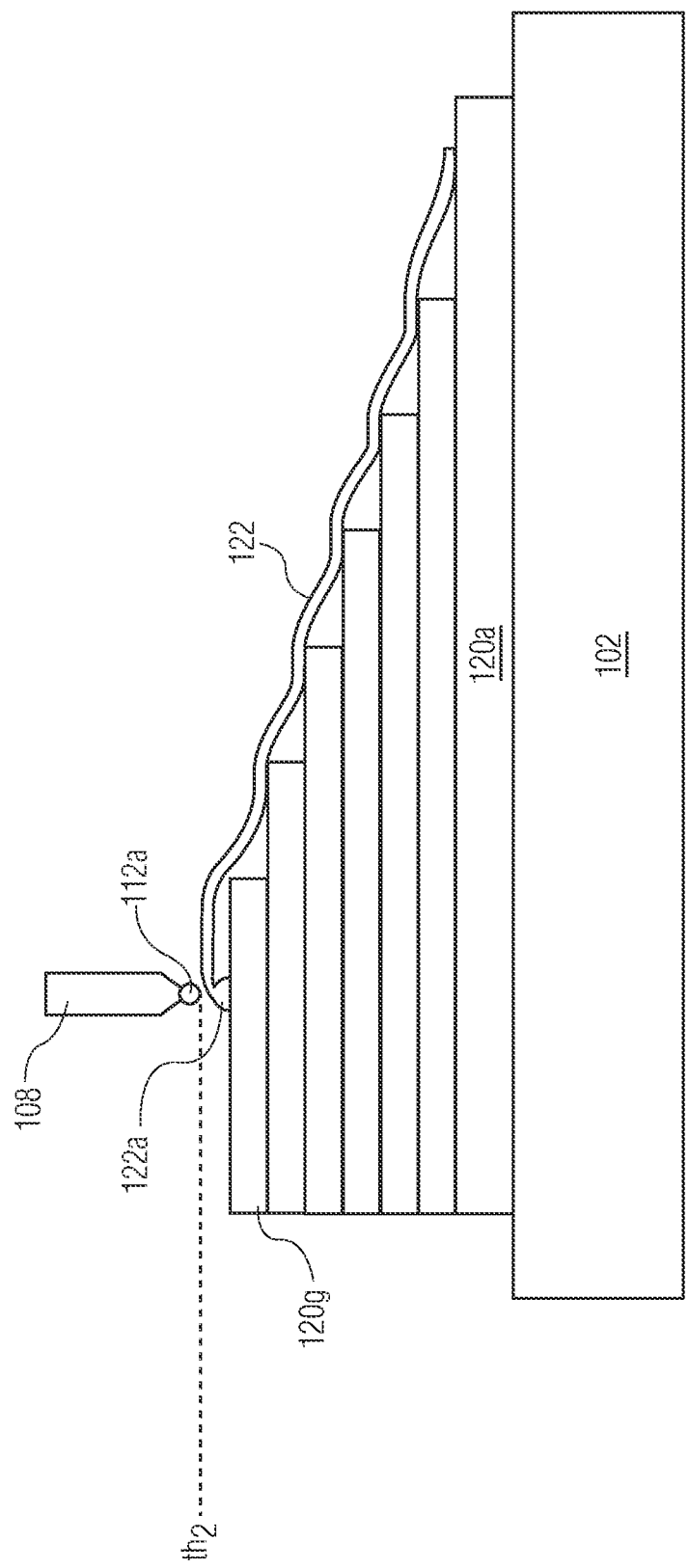

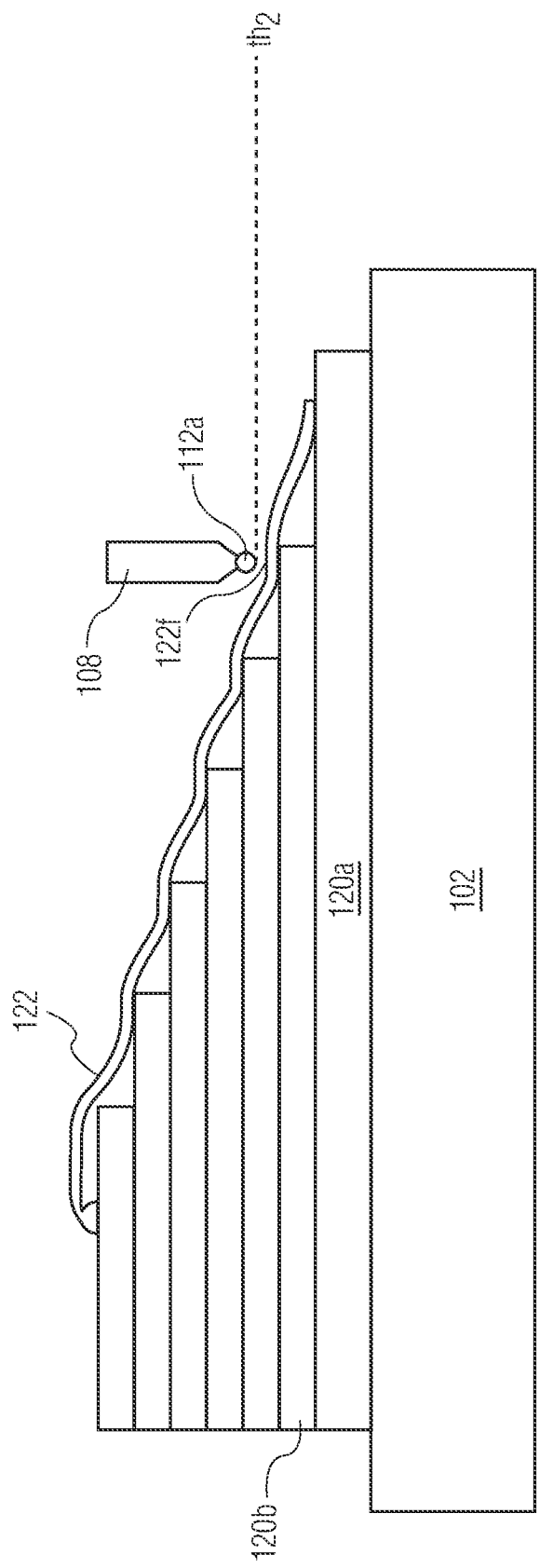

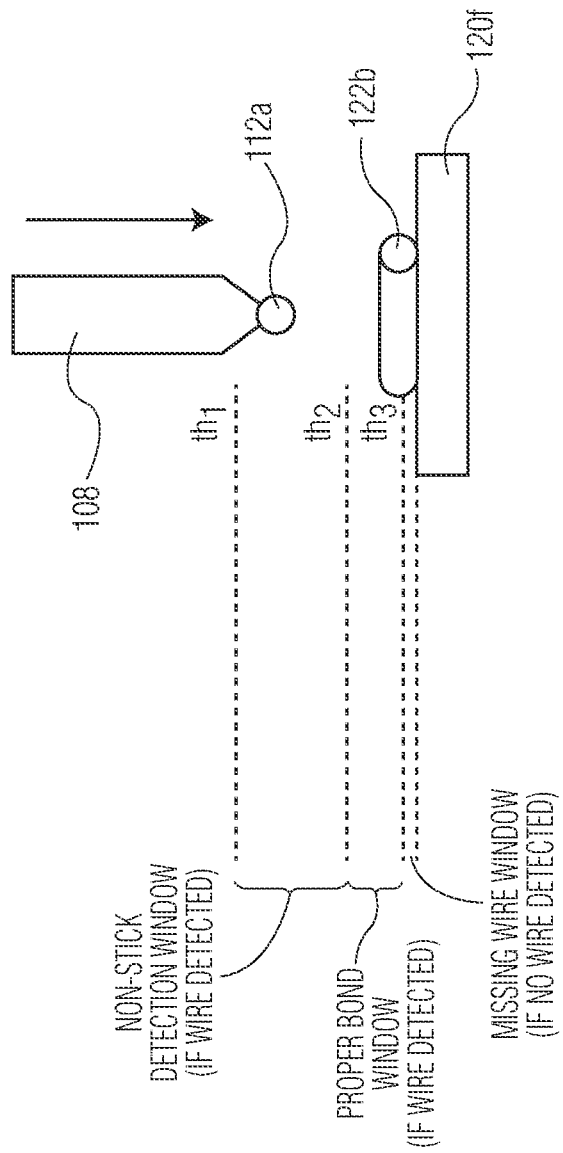

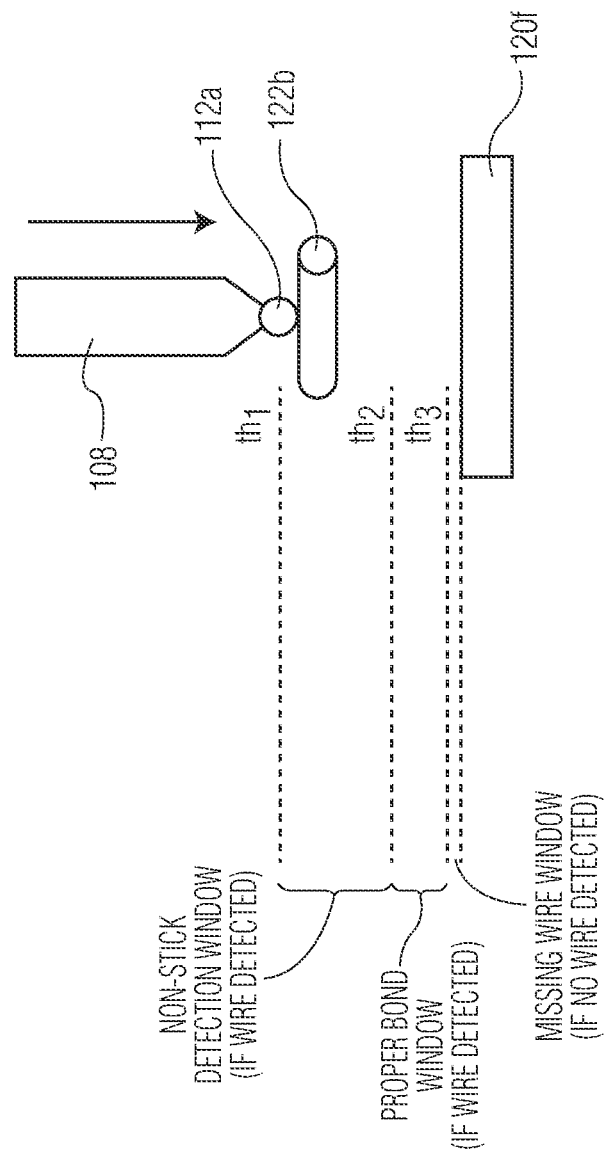

METHODS OF DETECTING BONDING BETWEEN A BONDING WIRE AND A BONDING LOCATION ON A WIRE BONDING MACHINE

CROSS REFERENCE TO RELATED APPLICATION

This application is a continuation of U.S. patent application Ser. No. 16/930,494 filed Jul. 16, 2020, which is a continuation of U.S. patent application Ser. No. 16/453,312 filed Jun. 26, 2019 which claims the benefit of U.S. Provisional Patent Application No. 62/692,608 filed Jun. 29, 2018, the contents of both of which are incorporated herein by reference.

FIELD

The invention relates to the formation of wire loops and other wire bonded structures, and more particularly, to improved methods of detecting the presence or absence of a bonded wire.

BACKGROUND

In the processing and packaging of semiconductor devices, wire bonding (e.g., ball bonding, wedge bonding, etc.) continues to be a widely used method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected.

An exemplary conventional wire bonding sequence (using ball bonding techniques) includes: (1) forming a free air ball on an end of a wire extending from a bonding tool; (2) forming a first bond on a die pad of a semiconductor die using the free air ball; (3) extending a length of wire in a desired shape between the die pad and a lead of a leadframe; (4) stitch bonding the wire to the lead of the leadframe; and (5) severing the wire. In forming the bonds between (a) the ends of the wire loop and (b) the bond site (e.g., a die pad, a lead, etc.) varying types of bonding energy may be used including, for example, ultrasonic energy, thermosonic energy, thermocompressive energy, amongst others.

In connection with wire bonding, it is often desirable to confirm that a portion of wire is properly bonded to a bonding location. Wire bonding machines marketed by Kulicke and Soffa Industries, Inc. often utilize a "BITS" process (i.e., Bond Integrity Test System) to confirm that proper wire bonds have been formed. Exemplary details of such processes is disclosed in International Patent Application Publication WO 2009/002345 which is incorporated by reference herein in its entirety.

Thus, it would be desirable to provide improved methods of determining whether a portion of wire (e.g., a portion of a wire loop) is properly bonded to a bonding location.

SUMMARY

According to an exemplary embodiment of the invention, a method of determining a bonding status between wire and at least one bonding location of a semiconductor device is provided. The method includes the steps of: (a) bonding a portion of wire to at least one bonding location of a semiconductor device using a bonding tool of a wire bonding machine; and (b) detecting whether another portion of wire engaged with the bonding tool, and separate from the portion of wire, contacts the portion of wire in a predetermined height range, thereby determining if the portion of wire is bonded to the at least one bonding location.

According to another exemplary embodiment of the invention, a method of determining a bonding status between wire and at least one bonding location of a semiconductor device is provided. The method includes the steps of: (a) bonding a portion of wire to at least one bonding location of a semiconductor device using a bonding tool of a wire bonding machine; and (b) detecting whether another portion of wire engaged with the bonding tool, and separate from the portion of wire, contacts the portion of wire in a non-stick height range.

According to another exemplary embodiment of the invention, a method of determining a bonding status between wire and at least one bonding location of a semiconductor device is provided. The method includes the steps of: (a) bonding a portion of wire to at least one bonding location of a semiconductor device using a bonding tool of a wire bonding machine; and (b) detecting whether another portion of wire engaged with the bonding tool, and separate from the portion of wire, contacts the portion of wire in a bonded height range, thereby determining if the portion of wire is bonded to the at least one bonding location.

In accordance with certain exemplary aspects of the invention, rather than "detecting whether the another portion of wire engaged with the bonding tool . . . contacts the portion of wire in a bonded height range", the methods disclosed herein may vary this step such that it is "detecting whether the another portion of wire engaged with the bonding tool . . . contacts the portion of wire, or an adjacent area of wire, in a bonded height range". That is, it may be desirable to not contact the actual bonded portion of wire because of potential damage to the underlying workpiece (e.g., a semiconductor die). Thus, the contact may be established at an adjacent part of the wire (e.g., a part of the wire loop overhanging the workpiece). Thus, it is understood that the step of "detecting whether the another portion of wire engaged with the bonding tool . . . contacts the portion of wire in a bonded height range" (and any similar language herein) also contemplates contacting an adjacent area of the wire (adjacent the bonded portion).

According to another exemplary embodiment of the invention, a method of determining a bonding status between wire and at least one bonding location of a semiconductor device is provided. The method includes the steps of: (a) bonding a portion of wire to at least one bonding location of a semiconductor device using a bonding tool of a wire bonding machine; and (b) detecting whether another portion of wire engaged with the bonding tool, and separate from the portion of wire, contacts the portion of wire within a missing wire height range, thereby determining if the portion of wire is bonded to the at least one bonding location.

According to another exemplary embodiment of the invention, a method of determining a bonding status between wire and at least one bonding location of a semiconductor device is provided. The method includes the steps of: (a) bonding a portion of wire to at least one bonding location of a semiconductor device using a bonding tool of a wire bonding machine; (b) detecting whether another portion of wire engaged with the bonding tool, and separate from the portion of wire, contacts the portion of wire in a non-stick height range; (c) if the another portion of wire engaged with the bonding tool does not contact the portion of wire in the non-stick height range in connection with step (b), detecting whether the another portion of wire engaged with the bonding tool contacts the portion of wire in a bonded height range that is lower than the non-stick height range; and (d) if the another portion of wire engaged with the bonding tool does not contact the portion of wire in the bonded height range in connection with step (c), detecting whether the another portion of wire engaged with the bonding tool contacts the bonding location in a missing wire height range that is lower than the bonded height range.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 1A is a block diagram view of a wire bonding system useful for explaining methods of determining a bonding status between a bonding wire and at least one bonding location of a semiconductor device in accordance with an exemplary embodiment of the invention;

FIGS. 2A-2H illustrate a method of determining a bonding status between a bonding wire and a plurality of bonding locations in accordance with an exemplary embodiment of the invention;

FIG. 3A-3C illustrate a method of determining a bonding status between a bonding wire and a bonding location in accordance with an exemplary embodiment of the invention;

FIGS. 5A-5G illustrate another method of determining a bonding status between a bonding wire and a plurality of bonding locations in accordance with an exemplary embodiment of the invention;

FIGS. 6A-6C illustrate a more detailed view of a method of determining a bonding status between a bonding wire and a bonding location in accordance with an exemplary embodiment of the invention;

FIGS. 7A-7B illustrate another more detailed view of another method of determining a bonding status between a bonding wire and a bonding location in accordance with an exemplary embodiment of the invention.

DETAILED DESCRIPTION

Figure 1B:
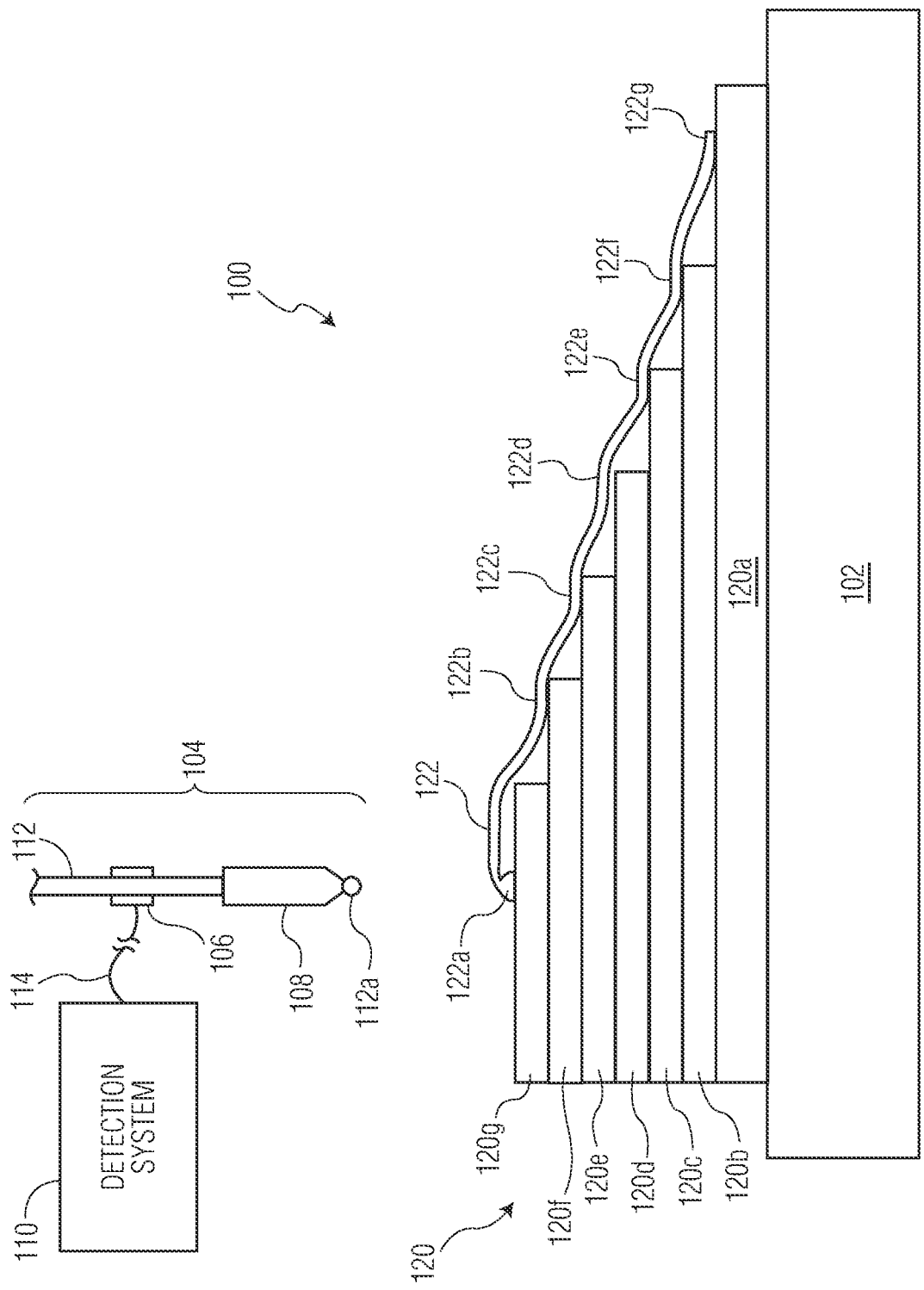
FIG. 1B is a block diagram view of the wire bonding system of FIG. 1A, illustrating a wire loop with a non-stick bonded portion, to be detected using a method in accordance with an exemplary embodiment of the invention.

As used herein, the term "semiconductor device" is intended to refer to any structure including (or configured to include at a later step) a semiconductor chip or die. Exemplary semiconductor devices include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, and a stack of semiconductor die, amongst others.

According to certain exemplary embodiments of the invention, methods of determining/detecting a bonding status of a wire bond connection to an electronic package (e.g., to a substrate, to a leadframe, to a semiconductor die, etc.) are provided. For example, methods of determining whether: a proper bond has been formed (e.g., a proper bonded condition); a portion of wire expected to be bonded is absent (e.g., a missing wire condition); a portion of wire expected to be bonded is not bonded (e.g., a non-stick condition); among others. For example, such methods may be performed in real time on a production wire bonding system (e.g., a wire bonding machine).

Certain methods according to the invention utilize a seated free air ball provided at the tip of the bonding tool, in connection with a detection system (such as a BITS system of Kulicke and Soffa Industries, Inc.) that utilizes the detection of a closed circuit (or an open circuit, or other electrical condition) to detect the presence or absence of a portion of wire expected to be bonded to a bonding location.

Referring now to FIG. 1A, a wire bonding system 100 is provided in accordance with an exemplary embodiment of the invention. Wire bonding system 100 includes a support structure 102 (e.g., a heat block, an anvil, etc.) for supporting a workpiece 120. In FIG. 1A, workpiece 120 includes a substrate 120a, and a plurality of stacked semiconductor die 120b, 120c, 120d, 120e, 120f, and 120g. A wire loop 122 has been formed to provide electrical interconnection between various bonding locations (e.g., bond pads, leads, conductive terminals, or other bonding locations). More specifically, wire loop 122 includes: bonded portion 122a bonded to a bonding location of semiconductor die 120g; bonded portion 122b bonded to a bonding location of semiconductor die 120f; bonded portion 122c bonded to a bonding location of semiconductor die 120e; bonded portion 122d bonded to a bonding location of semiconductor die 120d; bonded portion 122e bonded to a bonding location of semiconductor die 120c; bonded portion 122f bonded to a bonding location of semiconductor die 120b; and bonded portion 122g bonded to a bonding location of substrate 120a.

Wire bonding system 100 also includes a wire bonding tool 108 (e.g., a capillary wire bonding tool), a wire clamp 106, and detection system 110. Wire bonding tool 108 and wire clamp 106 are included as part of a bond head assembly 104. A length of wire 112 is provided to wire bonding tool 108 through wire clamp 106 (shown closed). A free air ball 112a (i.e., a portion of wire 112) is seated at the tip of wire bonding tool 108. An electrical connection 114 is provided between wire clamp 106 and detection system 110. As will be appreciated by those skilled in the art, using detection system 110, with wire clamp 106 in a closed position as shown in FIG. 1A, electrical continuity may be detected when free air ball 112a contacts a portion of wire loop 122 on workpiece 120.

For example, detection system 110 can detect a predetermined amount (e.g., a very small amount) of current. Such a detection system may be particularly desirable when the detection system is a DC (i.e., direct current) based circuit system. According to another example, the detection system can detect a predetermined change in capacitance that would occur when there is contact between free air ball 112a seated in wire bonding tool 108 and wire loop 122. Such a detection system may be particularly desirable when the detection system/circuit is an AC (i.e., alternating current) based system. The detection system/circuit may be configured to be very sensitive to the electrical change detected (e.g., a small amount of current flow, a small change in capacitance, etc), and as such, wire loop 122 will tend to not be deformed by gentle contact with free air ball 112a.

Figure 4B:
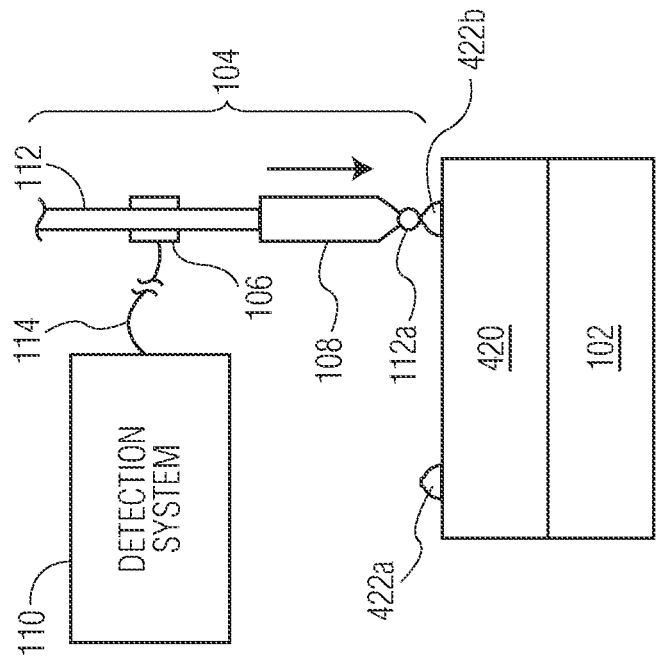
FIG. 4A-4B illustrate a method of determining a bonding status of a bump bond at a bonding location of a semiconductor device in accordance with another exemplary embodiment of the invention.
Figure 4A:
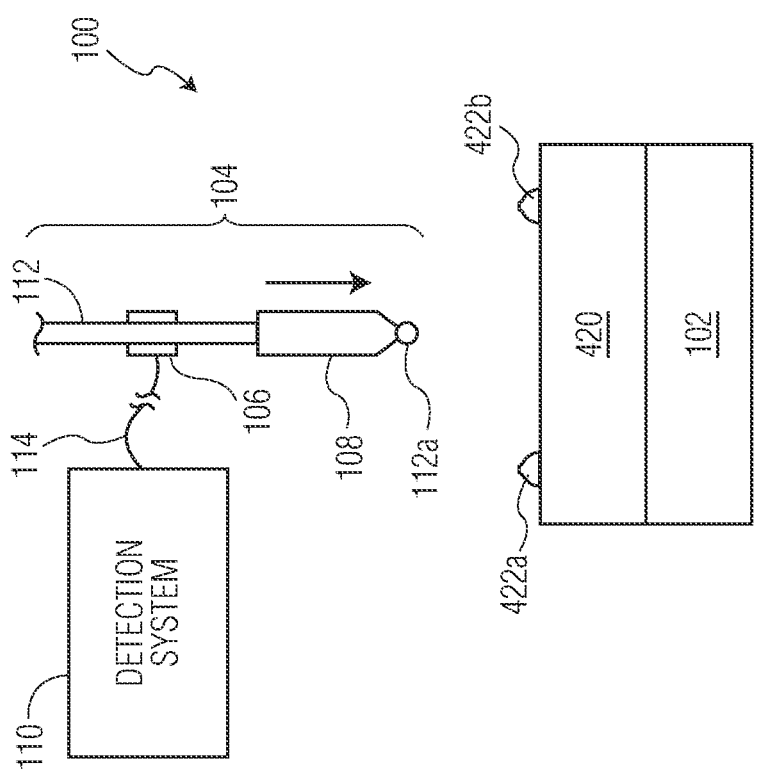
Figure 5B:
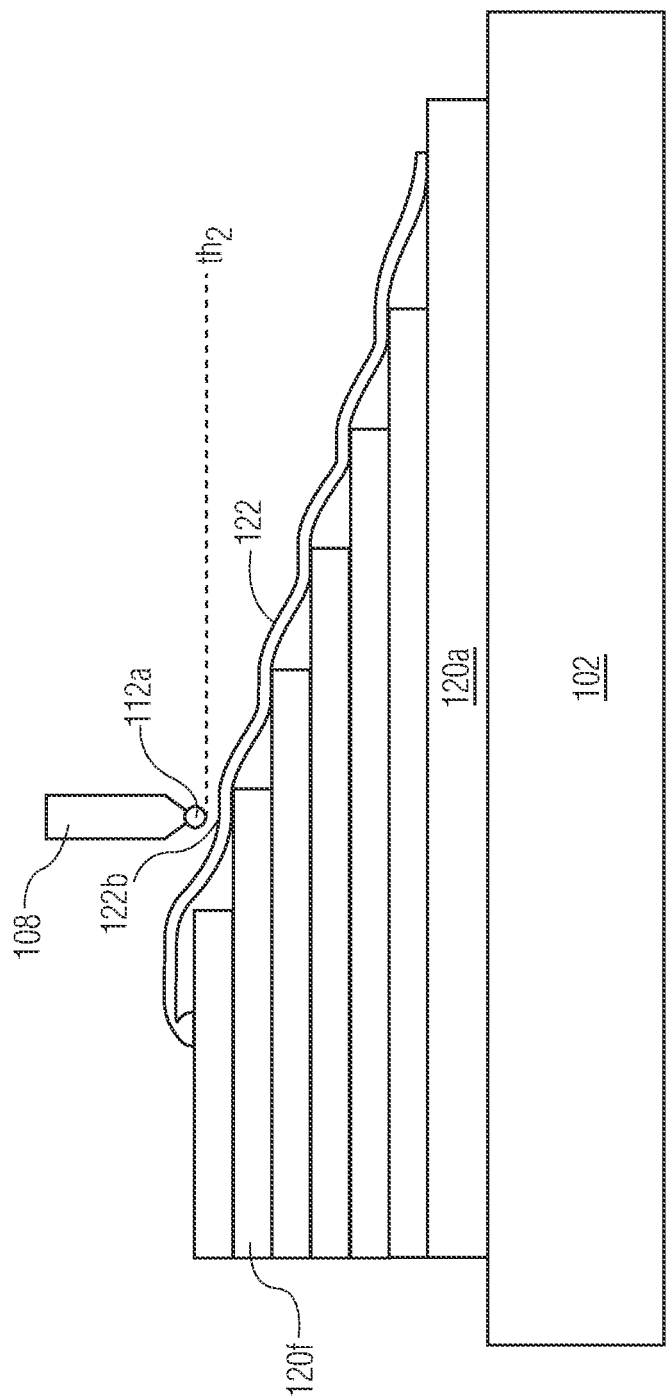
Figure 5C:
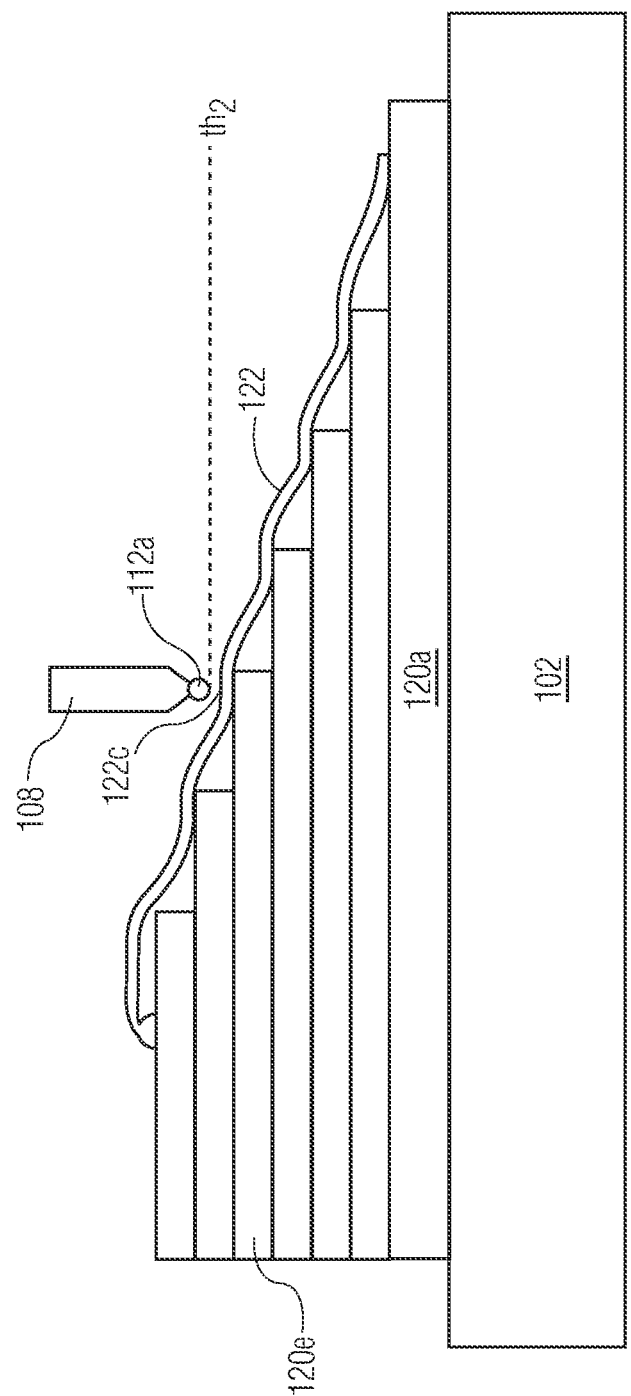
Figure 5D:
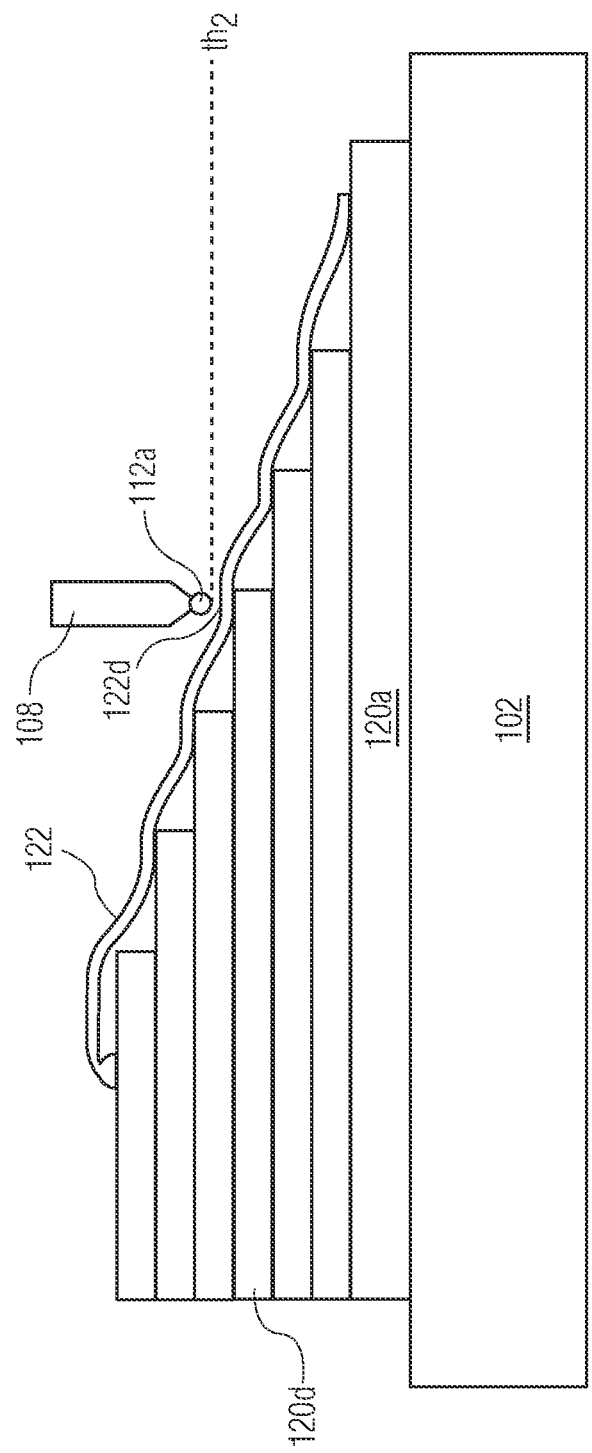
Figure 5E:
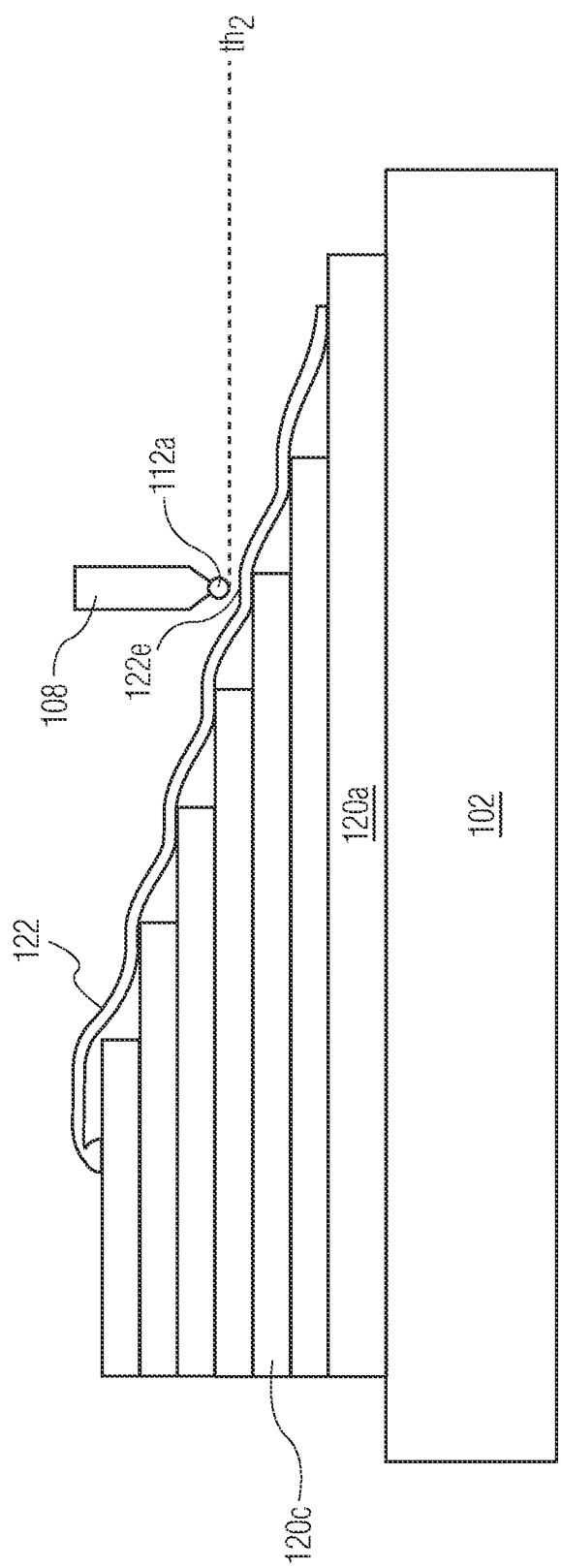
Figure 5G:
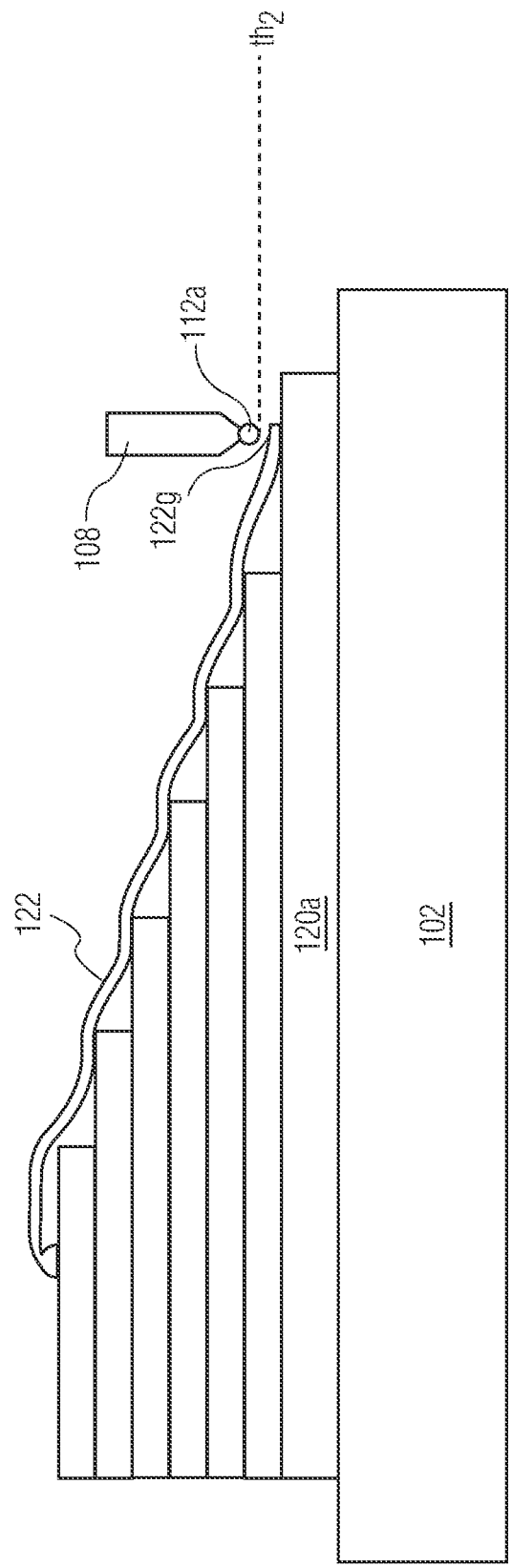

Using the various methods of the invention, real-time feedback regarding the bonding status of a portion of a wire loop (or other portion of wire such as a conductive bump as shown in FIGS. 4A-4B) may be provided to the wire bonding system.

Wire bonding system 100 shown in FIG. 1A is an example, and many variations are contemplated. For example, other types of wire loops (such as a simple wire loop including only a first bond, a second bond, and a length of wire therebetween (e.g., see FIGS. 3A-3C described below) are contemplated. Further, other portions of wire (not wire loops) are contemplated such as conductive bumps (e.g., see FIGS. 4A-4B described below). Further still, in a multi-bond type of wire loop (such wire loop 122 shown in FIG. 1A), conductive bumps may be provided under the various bonded portions such as bonded portions 122b-122f (where such conductive bumps may be termed "stand-offs"). Further still, as illustrated in FIG. 2H, safety bond 112a' (e.g., formed using free air ball 112a) may be included, for example, bonded onto the final bonded portion 122g.

Figure 2A:
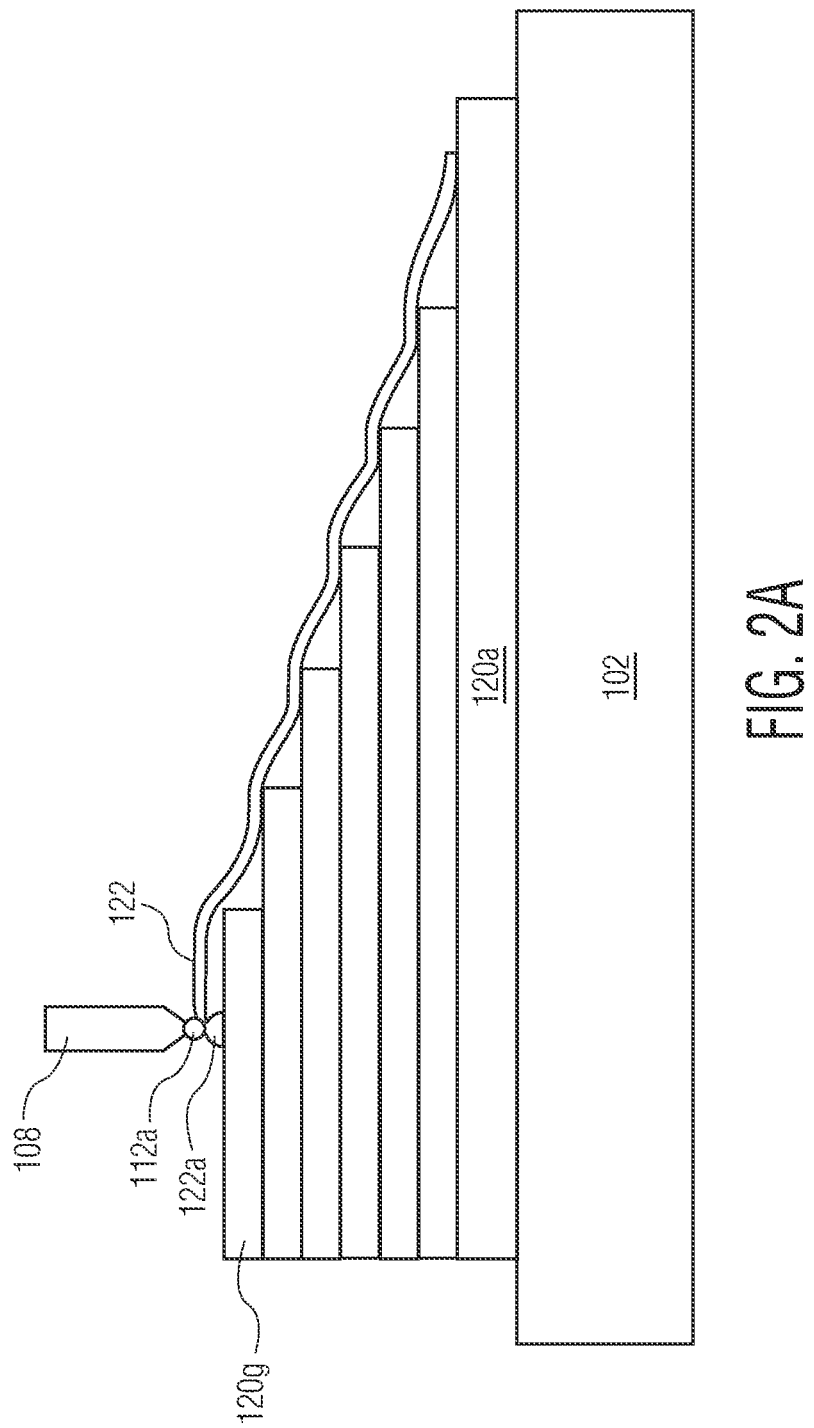
Figure 2D:
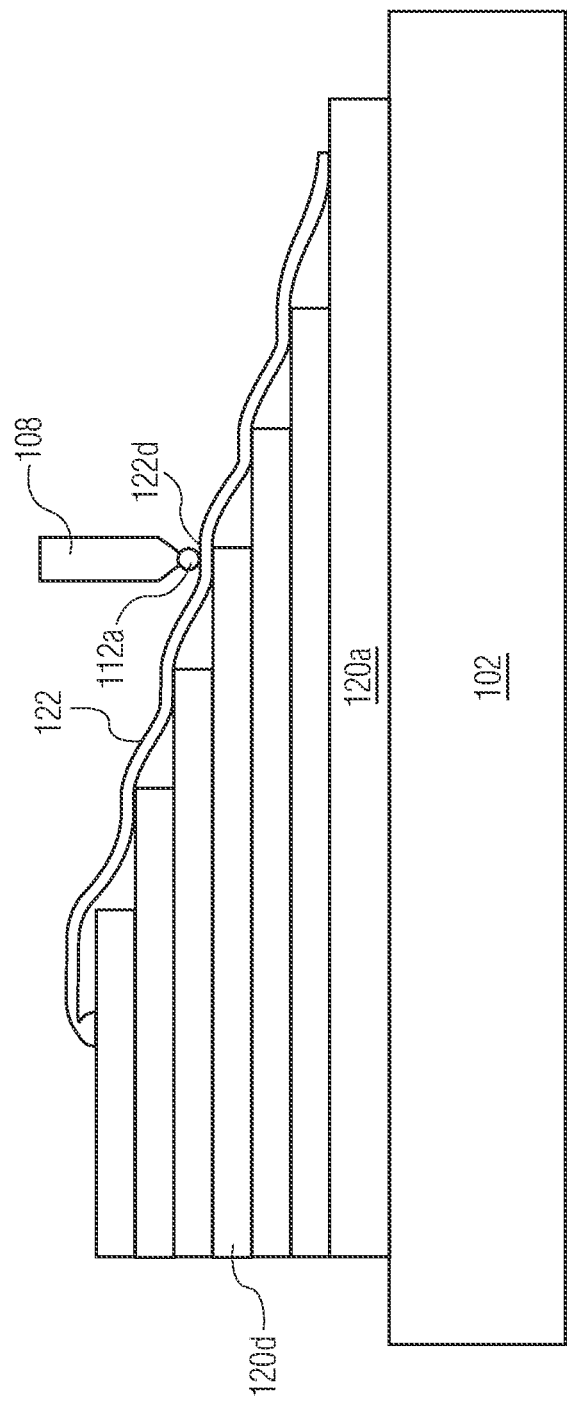
Figure 2E:
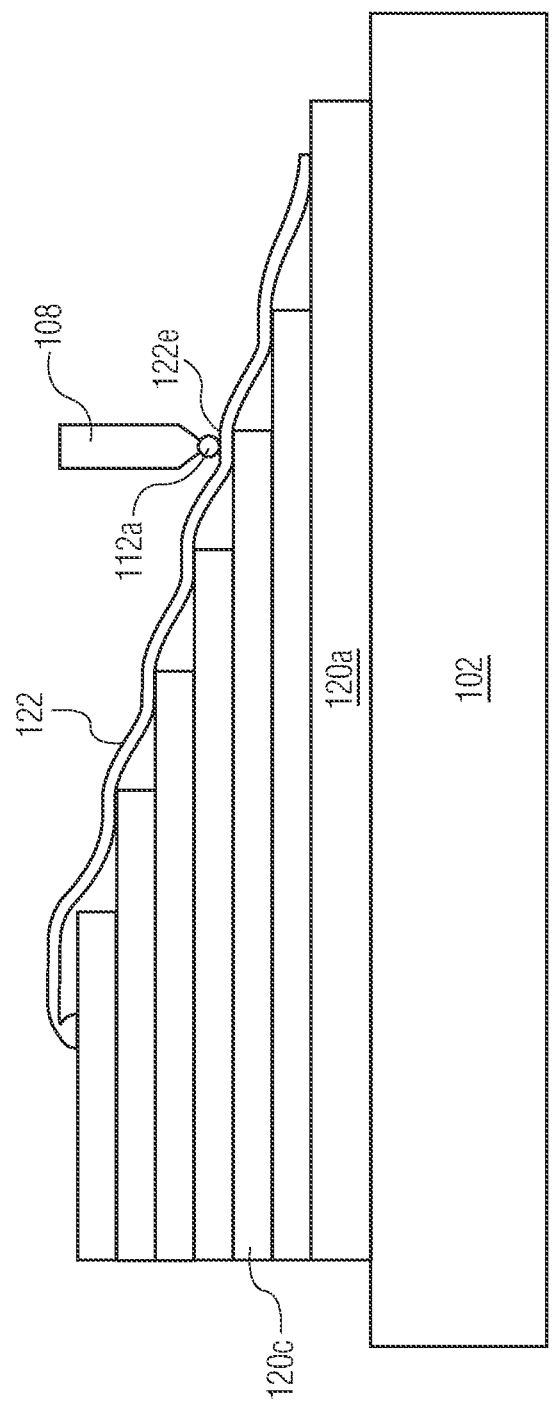
Figure 2F:
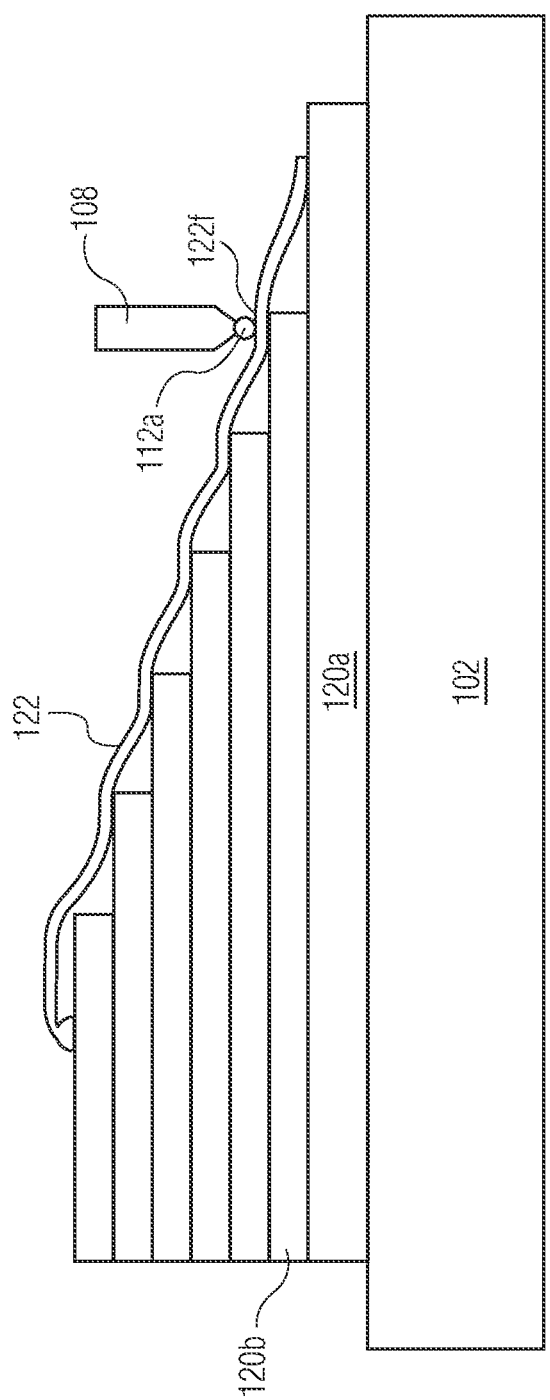
Figure 2G:
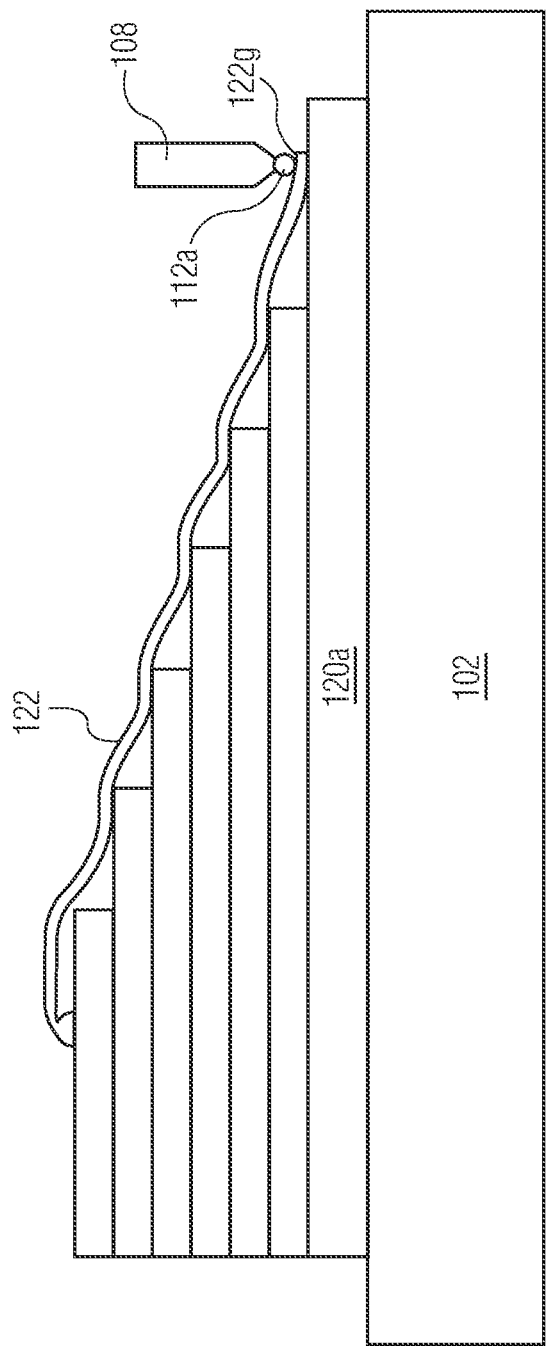
Figure 2H:
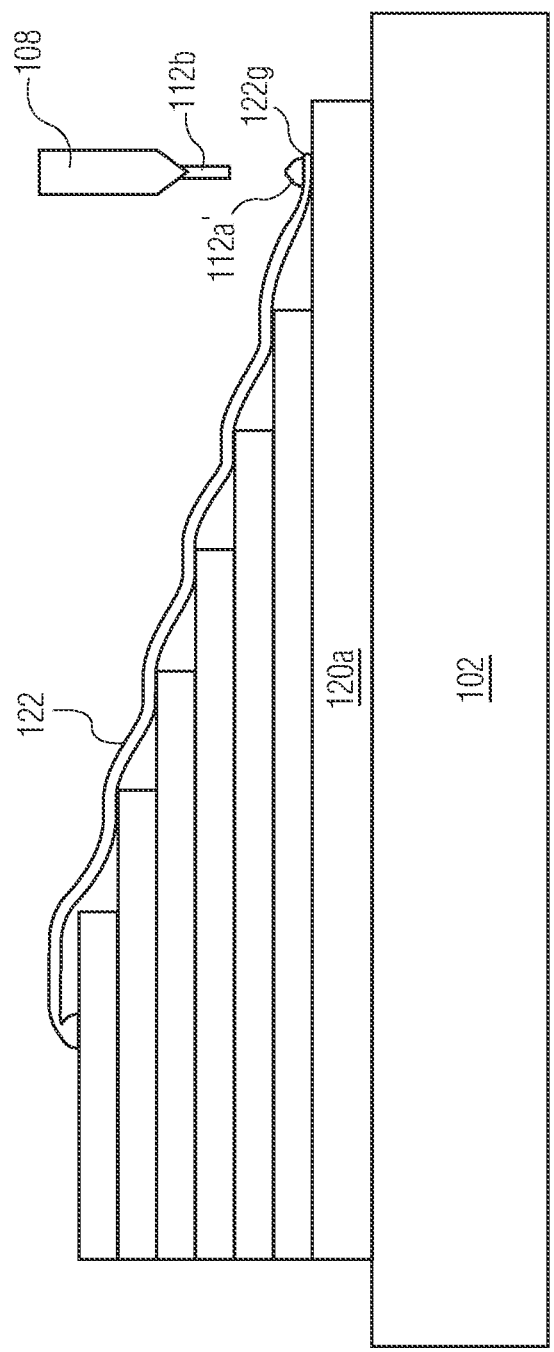
Figure 7A:
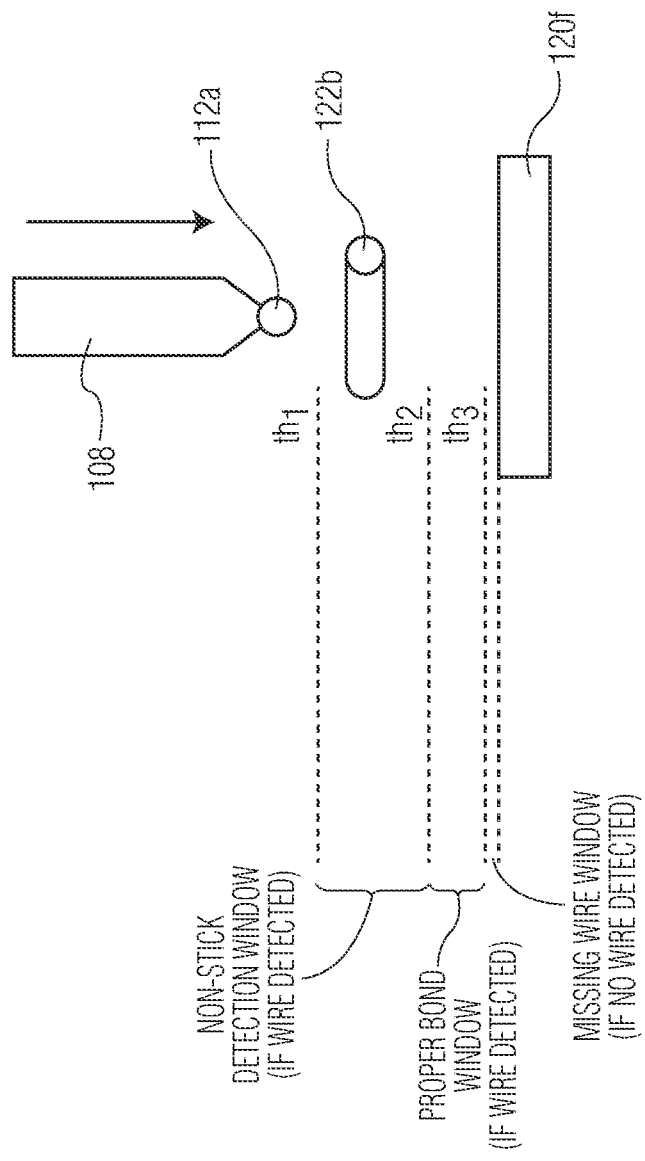

FIG. 1B illustrates the same wire bonding system of FIG. 1A (with the same reference numerals), and the same wire loop 122. However, in FIG. 1B, wire portion 122d of wire loop 122 is not properly bonded (it is in a non-stick condition). Aspects of the invention maybe used to detect conditions such as this non-stick condition, or a missing wire condition, etc. For example, FIGS. 7A-7B illustrate a condition similar to that of wire portion 122d in FIG. 1B that is not properly bonded to its associated bonding location. Thus, the method described in connection with FIGS. 7A-7B, or other methods described herein, may be used to detect the non-stick condition of wire portion 122d of FIG. 1B.

Specifically, FIGS. 2A-2G are a series of diagrams illustrating the detection of electrical continuity using detection system 110, through contact between free air ball 112a and various bonded portions 122a, 122b, 122c, 122d, 122e, 122f, 122g of wire loop 122. Through these successive electrical checks, proper bonding (or another bonding status) between the relevant portion of wire loop 122 (i.e., bonded portions 122a, 122b, 122c, 122d, 122e, 122f, 122g) and the corresponding bonding location (i.e., bonding locations on die 120g, 120f, 120e, 120d, 120c, 120b, and substrate 120a) may be detected.

Figure 3A:
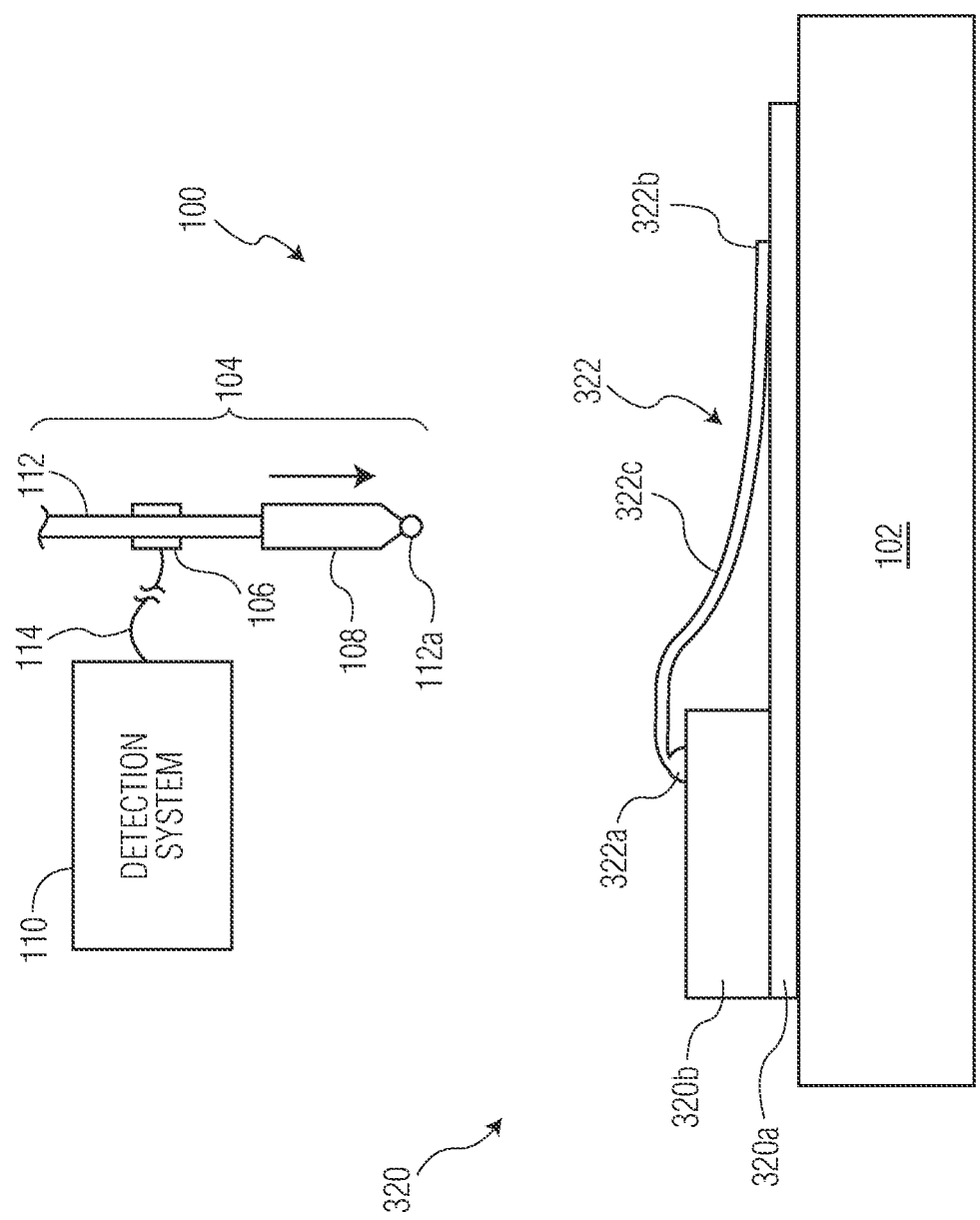

FIGS. 3A-3C are a series of diagrams illustrating a wire loop 322 (e.g., a simple wire loop as compared to wire loop 122 shown in FIG. 1A) on wire bonding system 100 (e.g., the same wire bonding system 100 of FIG. 1A). Wire loop 322 includes first bond 322a (a bonded portion), second bond 322b (a bonded portion), and a length of wire 322c therebetween. As provided above with respect to FIG. 1A), wire bonding system 100 includes detection system 110, bond head 104 (including wire bonding tool 108 and wire clamp 106), and support structure 102 (e.g., a heat block, an anvil, etc.) for supporting a workpiece 320. Workpiece 320 includes a substrate 320a and a semiconductor die 320b. As illustrated, wire loop 322 has been formed to provide electrical interconnection between (i) a bonding location of semiconductor die 320b and (ii) a bonding location of substrate 320a. This electrical interconnection is provided via first bond 322a bonded to the bonding location of semiconductor die 320b, and second bond 322b bonded to the bonding location of substrate 320a. FIG. 3B illustrates wire bonding tool 108 having been moved such that free air ball 112a contacts bonded portion 322a (i.e., a first bond of wire loop 322). Using detection system 110, electrical conductivity is sensed to determine if first bond 322a (also referred to as bonded portion 322a) is properly bonded to a bonding location of semiconductor die 320b. FIG. 3C illustrates wire bonding tool 108 having been moved such that free air ball 112a contacts second bond 322b (also referred to as bonded portion 322b). Using detection system 110, electrical conductivity is sensed to determine if second bond 322b is properly bonded to a bonding location of substrate 320a. Through these electrical conductivity checks, a determination may be made as to whether the relevant portion of a wire loop (i.e., bonded portions 322a, 322b) is properly bonded to a corresponding bonding location (i.e., bonding locations on die 320b and substrate 320a).

FIGS. 4A-4B are a series of diagrams illustrating the detection of electrical continuity of portions of wire that are not wire loops, that is, wire bumps 422a, 422b (also referred to as bonded portions 422a, 422b) formed on workpiece 420 at respective bonding locations. Wire bonding system 100 includes detection system 110, bond head assembly 104 (including wire bonding tool 108 and wire clamp 106), and support structure 102 (e.g., a heat block, an anvil, etc.) for supporting workpiece 420. FIG. 4B illustrates wire bonding tool 108 having been moved such that free air ball 112a contacts bonded portion 422b (i.e., a wire bump, sometimes referred to as a stud bump). Using detection system 110, electrical conductivity is sensed to determine if bonded portion 422b is properly bonded to a bonding location of workpiece 420 (e.g., a semiconductor device, a substrate, a semiconductor wafer, etc.). Through this electrical check, a determination may be made as to whether the relevant bonded portion of a wire (in this case, bonded portion 422b) is properly bonded to the corresponding bonding location (i.e., bonding locations on workpiece 420).

As illustrated in FIGS. 5A-5G (with portions of wire bonding system 100, including detection system 110, removed for simplicity), rather than contact each of expected bonded portions 122a, 122b, 122c, 122d, 122e, 122f, 122g (i.e., respective bonds of wire loop 122 to bonding locations of semiconductor die 120g, 120f, 120e, 120d, 120c, 120b, and substrate 120a) of wire loop 122, a different type of check may be completed. For example, free air ball 112a may sequentially (or in any desired order of succession) be lowered to respective predetermined threshold heights $th_2$ directly above each of the expected locations of bonded portions 122a, 122b, 122c, 122d, 122e, 122f, 122g. If no electrical continuity detected at height $th_2$ (or in window $th_1$-$th_2$, e.g. see FIGS. 6A-6C), it provides some level of assurance of a proper bond, because otherwise the respective expected bonded portions 122a, 122b, 122c, 122d, 122e, 122f, 122g may be spaced directly above the corresponding bonding location, that is at or above the respective predetermined threshold height $th_2$, and electrical continuity would be detected indicating, for example, a non-stick condition. Specifically, FIGS. 5A-5G illustrate such an approach. For each of the bonded portions 122a, 122b, 122c, 122d, 122e, 122f, 122g, free air ball 112a is lowered to respective predetermined threshold height $th_2$, to detect if there is electrical continuity. As illustrated in FIGS. 5A-5G, no such electrical continuity is detected and a level of assurance is given that each bonded portion 122a, 122b, 122c, 122d, 122e, 122f, 122g is properly bonded to its respective bonding location.

Figure 6A:
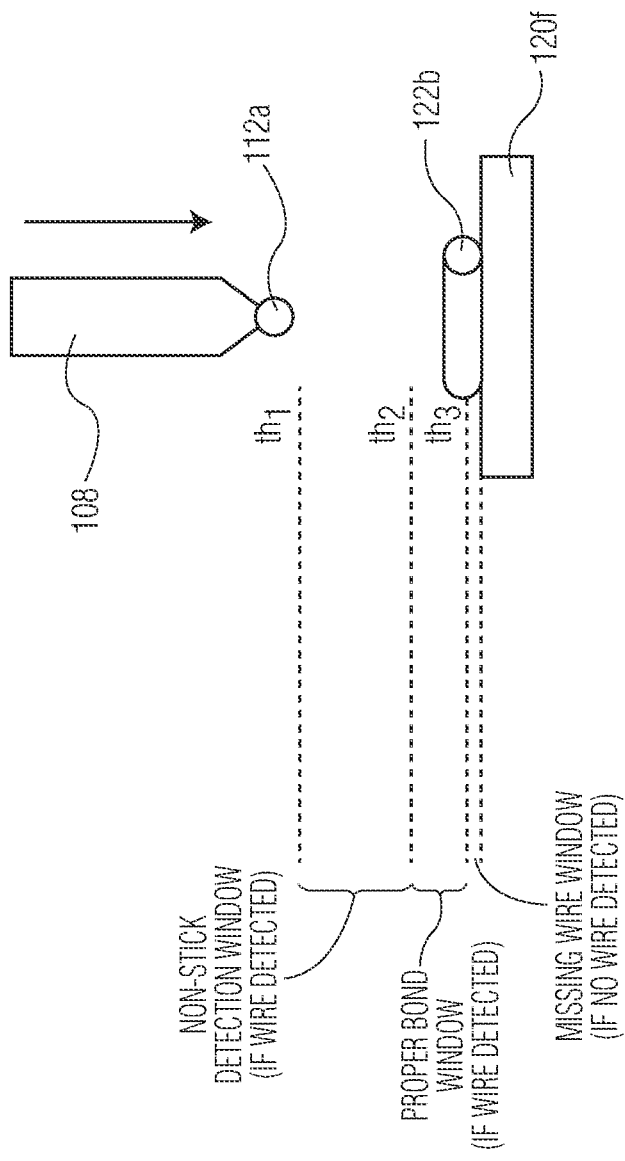
Figure 6C:
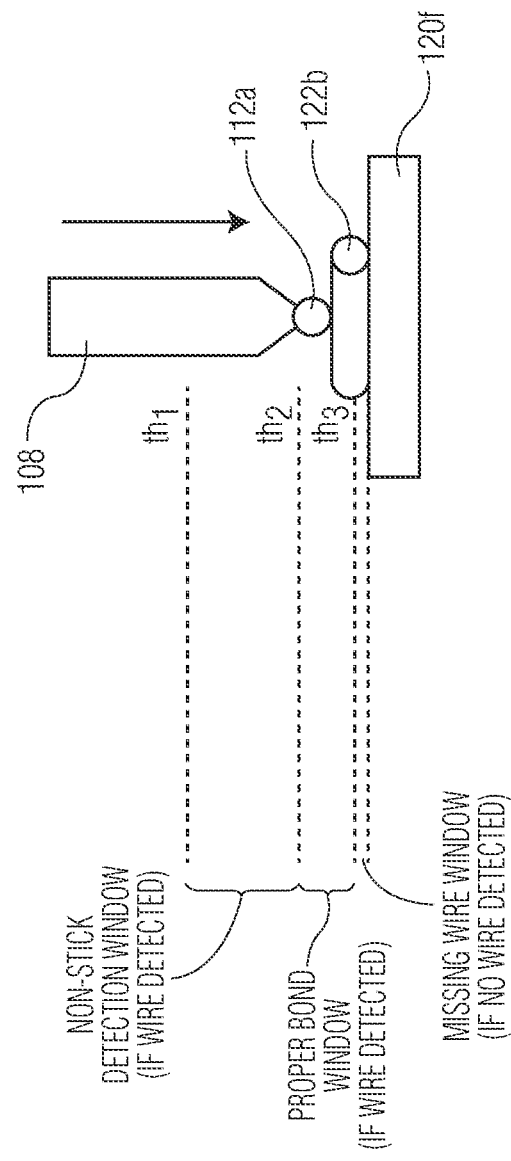

FIGS. 6A-6C, 7A-7B and 8A-8C illustrate examples of respective detailed processes. Three (3) windows are illustrated in each set of FIGS. 6A-6C, 7A-7B, and 8A-8C. A first window th1-th2 (NON-STICK DETECTION WINDOW (IF WIRE DETECTED)) is provided between heights th1 and th2 (where th1 and th2 are threshold heights above a bonding location determined for the specific application). If a wire is detected in first window th1-th2, it indicates that bonded portion 122b is a non-stick bond (e.g., see FIGS. 7A-7B). That is, in FIGS. 7A-7B, bonded portion 122b is not properly bonded to bonding location of die 120f. A second window th2-th3 (PROPER BOND WINDOW (IF WIRE DETECTED)) is provided between heights th2 and th3 above a bonding location (where th2 and th3 are threshold heights determined for the specific application). If a wire is not detected first window th1-th2, but is detected in this second window th2-th3, it indicates that bonded portion 122b is properly bonded (e.g., see FIGS. 6A-6C). A third window th3-above surface (MISSING WIRE WINDOW (IF NO WIRE DETECTED)) is provided between heights th3 and the surface of a bonding location of die 120f. If a wire is not detected first window th1-th2, or in second window th2-th3, and no wire is detected in third window th3-above surface, it indicates that the wire is missing (e.g., see FIGS. 8A-8C and the absence of any bonded portion 122b). Third window th3-above surface may desirably be limited to some height just above the surface of each bonding location. Specifically, FIG. 6B illustrates descent of free air ball 112a (through motion of tool 108) through first window $th_1$-$th_2$, with no contact detected. Bonding tool 108 continues to descend, and as shown in FIG. 6C, contact is established with bonded portion 122b in second window $th_2$-$th_3$, indicating that bonded portion 122b is properly bonded to a bonding location of die 120f.

FIGS. 7A-7B illustrate the same windows (i.e., NON-STICK DETECTION WINDOW, PROPER BOND WINDOW, AND MISSING WIRE WINDOW), but in FIGS. 7A-7B, wire portion 122b is not bonded to the bonding location of die 120f. Instead, wire portion 122b (i.e., in this instance, failed wire bond 122b) is directly above the surface of the bonding location of die 120f. Thus, in FIG. 7B, contact is established in first window $th_1$-$th_2$ indicating that there is a non-stick condition.

Figure 8A:
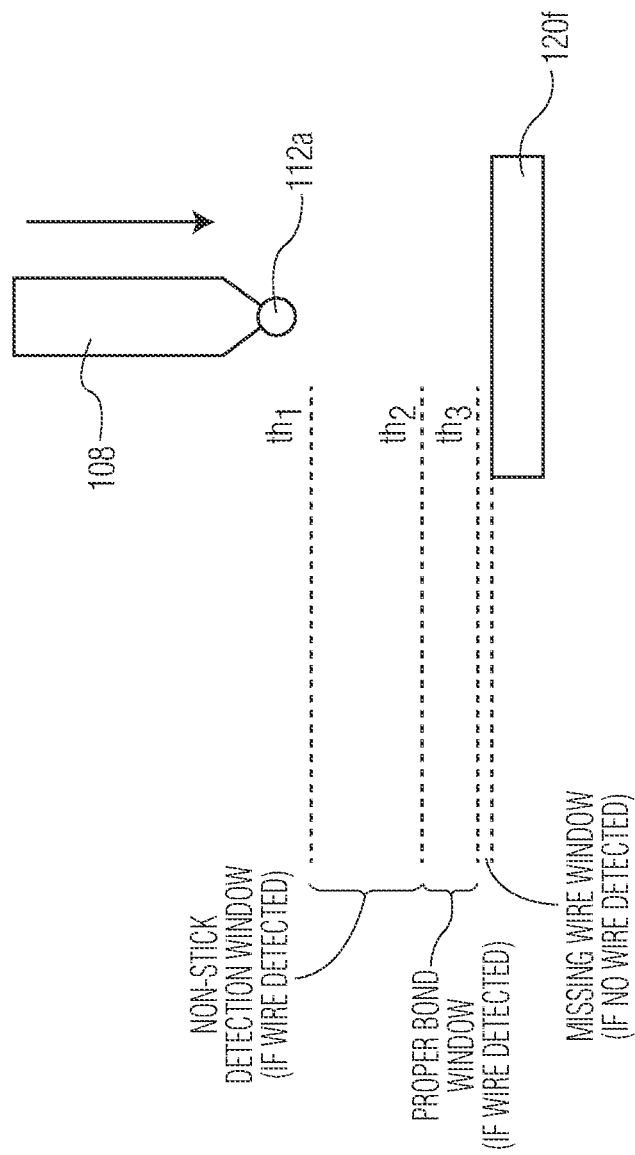
FIGS. 8A-8C illustrate yet another more detailed view of yet another method of determining a bonding status between a bonding wire and a bonding location in accordance with an exemplary embodiment of the invention.
Figure 8B:
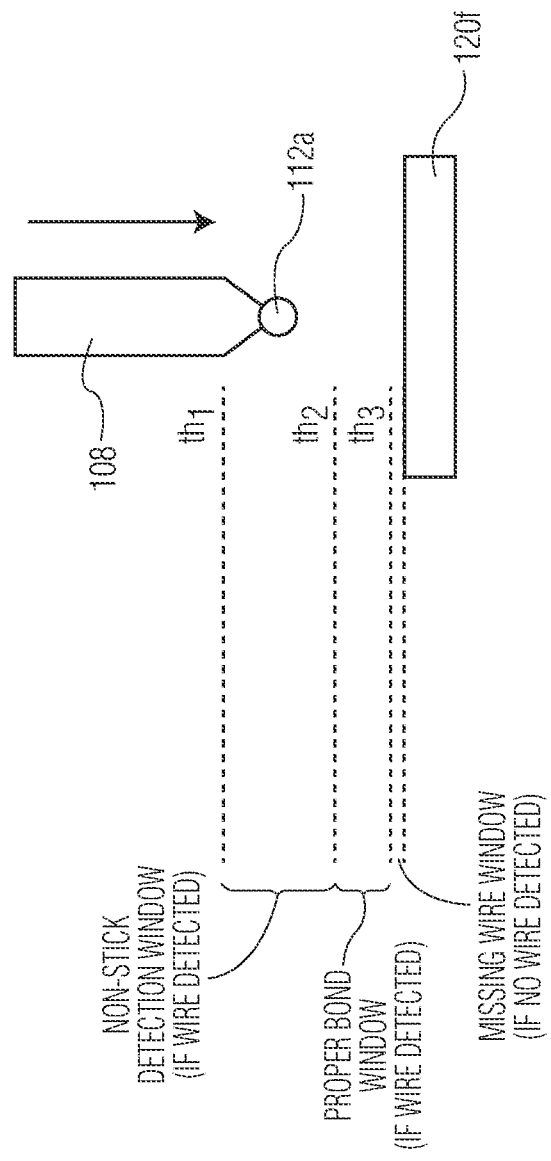
Figure 8C:
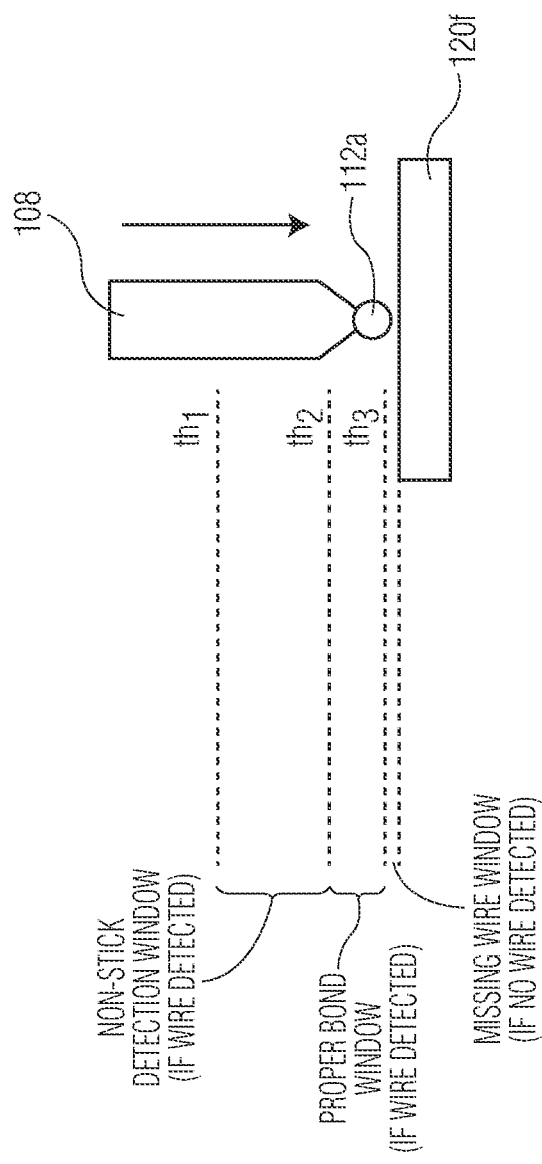

FIGS. 8A-8C illustrate the same windows (i.e., NON-STICK DETECTION WINDOW, PROPER BOND WINDOW, AND MISSING WIRE WINDOW), but in FIGS. 8A-8C there is no wire portion 122b directly above the bonding location of die 120f-instead, it is missing (i.e., in this instance, missing wire bond 122b). Between FIGS. 8B-8C, free air ball 112a descends to just above the surface of the bonding location of die 120f but no contact is established. When free air ball 112a descends to the bottom of the MISSING WIRE WINDOW without detecting electrical conductivity (see FIG. 8C), it is established that the wire (i.e., wire portion, or wire bond, 122b) is missing.

Although FIGS. 6A-6C, FIGS. 7A-7B, and FIGS. 8A-8C illustrate all three height ranges (i.e., NON-STICK DETECTION WINDOW, PROPER BOND WINDOW, AND MISSING WIRE WINDOW) it is understood that according to aspects of the invention, any one or more of these ranges may be checked independent of the others. For example, FIGS. 5A-5G illustrate a check to determine if a wire portion is present in the NON-STICK DETECTION WINDOW only. Likewise, a check may be performed for the presence of a wire portion in the PROPER BOND WINDOW only, or in the MISSING WIRE WINDOW only, or any combination of these windows.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of determining a bonding status between wire and the at least one bonding location of a semiconductor device, the method comprising the steps of:
   (a) bonding a portion of wire to at least one bonding location of a semiconductor device using a bonding tool of a wire bonding machine; and
   (b) detecting contact between (i) another portion of wire engaged with the bonding tool, and separate from the portion of wire, and (ii) the portion of wire in a non-stick height range.

2. The method of claim 1 wherein the portion of wire is bonded to a single bonding location of the semiconductor device, and wherein after step (a) the portion of wire is a conductive bump bonded to the single bonding location.

3. The method of claim 1 wherein the portion of wire is bonded to a plurality of bonding locations of the semiconductor device, and wherein after step (a) the portion of wire is a wire loop providing electrical interconnection between the plurality of bonding locations.

4. The method of claim 1 wherein step (b) includes detecting contact between (i) the another portion of wire engaged with the bonding tool and (ii) each of a plurality of areas of the portion of wire within corresponding non-stick height ranges, thereby determining if the portion of wire is bonded at each of the plurality of areas to corresponding bonding locations of the semiconductor device.

5. The method of claim 1 wherein the another portion of wire is a free air ball seated at a tip of the bonding tool.

6. The method of claim 1 wherein step (b) includes detecting whether a conductive path is established between (i) the another portion of wire, and (ii) the portion of wire.

7. The method of claim 6 wherein step (b) includes detecting whether the conductive path is established by detecting at least one of (i) a predetermined current flow in the conductive path, (ii) a predetermined change in capacitance between the conductive path and a ground connection of the wire bonding system, and (iii) a predetermined phase shift of current flowing in the conductive path.

8. The method of claim 1 wherein step (b) includes detecting whether the another portion of wire engaged with the bonding tool contacts the portion of wire using a conductive path established between (i) a detection system for detecting whether the another portion of wire engaged with the bonding tool contacts the portion of wire, and (ii) the portion of wire.

9. The method of claim 1 wherein the portion of wire is a second bond of a wire loop.

10. A method of determining a bonding status between wire and the at least one bonding location of a semiconductor device, the method comprising the steps of:
    (a) bonding a portion of wire to at least one bonding location of a semiconductor device using a bonding tool of a wire bonding machine, the portion of wire being a free air ball seated at a tip of the bonding tool;
    (b) detecting whether another portion of wire engaged with the bonding tool, and separate from the portion of wire, contacts the portion of wire in a non-stick height range; and
    (c) after step (b), bonding the free air ball to a stitch bond of the wire loop.

11. A method of determining a bonding status between wire and the at least one bonding location of a semiconductor device, the method comprising the steps of:

(a) bonding a portion of wire to at least one bonding location of a semiconductor device using a bonding tool of a wire bonding machine, the portion of wire being a free air ball seated at a tip of the bonding tool;

(b) lowering another portion of wire engaged with the bonding tool, and separate from the portion of wire, to a non-stick height range above the bonding location;

(c) detecting, at the non-stick height range, whether the another portion of wire contacts the portion of wire in the non-stick height range; and (d) after step (c), bonding the free air ball to a stitch bond of the wire loop.

12. The method of claim 11 wherein the portion of wire is bonded to a single bonding location of the semiconductor device, and wherein after step (a) the portion of wire is a conductive bump bonded to the single bonding location.

13. The method of claim 11 wherein the portion of wire is bonded to a plurality of bonding locations of the semiconductor device, and wherein after step (a) the portion of wire is a wire loop providing electrical interconnection between the plurality of bonding locations.

14. The method of claim 11 wherein steps (b) and (c) include detecting whether the another portion of wire engaged with the bonding tool contacts each of a plurality of areas of the portion of wire within corresponding non-stick height ranges, thereby determining the bonding status at each of the plurality of areas to corresponding bonding locations of the semiconductor device.

15. The method of claim 11 wherein step (c) includes detecting whether a conductive path is established between (i) the another portion of wire, and (ii) the portion of wire.

16. The method of claim 15 wherein step (c) includes detecting whether the conductive path is established by detecting at least one of (i) a predetermined current flow in the conductive path, (ii) a predetermined change in capacitance between the conductive path and a ground connection of the wire bonding system, and (iii) a predetermined phase shift of current flowing in the conductive path.

17. The method of claim 11 wherein step (c) includes detecting whether the another portion of wire engaged with the bonding tool contacts the portion of wire using a conductive path established between (i) a detection system for detecting whether the another portion of wire engaged with the bonding tool contacts the portion of wire, and (ii) the portion of wire.

18. The method of claim 11 wherein the portion of wire is a second bond of a wire loop.

* * * * *